(12) United States Patent
Benjamin et al.

(10) Patent No.: US 8,963,052 B2
(45) Date of Patent: Feb. 24, 2015

(54) METHOD FOR CONTROLLING SPATIAL TEMPERATURE DISTRIBUTION ACROSS A SEMICONDUCTOR WAFER

(75) Inventors: Neil Benjamin, East Palo Alto, CA (US); Robert Steger, Los Altos, CA (US)

(73) Assignee: Lam Research Corporation, Fremont, CA (US)

( * ) Notice: Subject to any disclaimer, the term of this patent is extended or adjusted under 35 U.S.C. 154(b) by 1160 days.

(21) Appl. No.: 12/436,443

(22) Filed: May 6, 2009

(65) Prior Publication Data

US 2009/0215201 A1    Aug. 27, 2009

Related U.S. Application Data

(60) Division of application No. 11/004,179, filed on Dec. 2, 2004, now abandoned, which is a continuation-in-part of application No. 10/062,395, filed on Feb. 1, 2002, now Pat. No. 6,847,014, which is a continuation-in-part of application No. 09/846,432, filed on Apr. 30, 2001, now abandoned.

(51) Int. Cl.
*H05B 3/68* (2006.01)
*H01L 21/302* (2006.01)
(Continued)

(52) U.S. Cl.
CPC .... *H01L 21/68714* (2013.01); *H01L 21/67069* (2013.01); *H01L 21/67103* (2013.01); *H01L 21/67248* (2013.01); *H01L 21/6833* (2013.01); *H01J 2237/2001* (2013.01)
USPC ...................... 219/444.1; 438/715; 118/723 R (58) Field of Classification Search
USPC ................. 219/444.1, 121.36; 438/706–715; 156/345.51–345.54; 118/723 R, 118/723 VE, 723 E, 723 ER, 723 I, 723 IR, 118/724, 725
See application file for complete search history.

(56) References Cited

U.S. PATENT DOCUMENTS

| 2,152,126 A | 3/1939 | Young |
| 3,634,740 A | 1/1972 | Stevko |

(Continued)

FOREIGN PATENT DOCUMENTS

| JP | 61-280613 | 12/1986 |
| JP | 04-360526 H | 12/1992 |

(Continued)

OTHER PUBLICATIONS

Japanese Official Action (English translation attached) dated Mar. 8, 2010 for Japanese Patent Appln. No. 2002-586683.

(Continued)

*Primary Examiner* — Sang Y Paik
(74) *Attorney, Agent, or Firm* — Buchanan Ingersoll & Rooney PC (57) ABSTRACT

A chuck for a plasma processor comprises a temperature-controlled base, a thermal insulator, a flat support, and a heater. The temperature-controlled base is controlled in operation a temperature below the desired temperature of a workpiece. The thermal insulator is disposed over at least a portion of the temperature-controlled base. The flat support holds a workpiece and is disposed over the thermal insulator. A heater is embedded within the flat support and/or mounted to an underside of the flat support. The heater includes a plurality of heating elements that heat a plurality of corresponding heating zones. The power supplied and/or temperature of each heating element is controlled independently. The heater and flat support have a combined temperature rate change of at least 1° C. per second.

20 Claims, 4 Drawing Sheets

(51) Int. Cl.
*C23C 16/00* (2006.01)
*H01L 21/687* (2006.01)
*H01L 21/67* (2006.01)
*H01L 21/683* (2006.01)

(56) References Cited

U.S. PATENT DOCUMENTS

| | | |
|---|---|---|
| 4,361,749 A | 11/1982 | Lord |
| 4,518,848 A | 5/1985 | Weber |
| 5,059,770 A | 10/1991 | Mahawili |
| 5,192,849 A | 3/1993 | Moslehi |
| 5,290,381 A | 3/1994 | Nozawa et al. |
| 5,294,778 A | 3/1994 | Carman et al. |
| 5,376,213 A | 12/1994 | Ueda et al. |
| 5,401,316 A | 3/1995 | Shiraishi et al. |
| 5,413,360 A | 5/1995 | Atari et al. |
| 5,460,684 A | 10/1995 | Saeki et al. |
| 5,529,657 A | 6/1996 | Ishii |
| 5,539,179 A | 7/1996 | Nozawa et al. |
| 5,580,607 A | 12/1996 | Takekuma et al. |
| 5,591,269 A | 1/1997 | Arami et al. |
| 5,616,024 A | 4/1997 | Nobori et al. |
| 5,802,856 A | 9/1998 | Schaper et al. |
| 5,846,375 A | 12/1998 | Gilchrist et al. |
| 5,851,641 A | 12/1998 | Matsunaga et al. |
| 5,854,468 A | 12/1998 | Muka |
| 5,925,227 A | 7/1999 | Kobayashi et al. |
| 5,978,202 A | 11/1999 | Wadensweiler et al. |
| 5,981,913 A | 11/1999 | Kadomura et al. |
| 6,048,434 A | 4/2000 | Tamura et al. |
| 6,051,303 A | 4/2000 | Katsuda et al. |
| 6,080,969 A | 6/2000 | Goto et al. |
| 6,080,970 A | 6/2000 | Yoshida et al. |
| 6,084,215 A | 7/2000 | Furuya et al. |
| 6,259,592 B1 | 7/2001 | Ono |
| 6,310,755 B1 | 10/2001 | Kholodenko et al. |
| 6,320,737 B1 | 11/2001 | Hirano et al. |
| 6,365,879 B1 | 4/2002 | Kuibira et al. |
| 6,379,222 B2 | 4/2002 | Wise et al. |
| 6,448,538 B1 | 9/2002 | Miyata |
| 6,472,643 B1 | 10/2002 | Babikian |
| 6,482,747 B1 | 11/2002 | Takahashi et al. |
| 6,508,884 B2 | 1/2003 | Kuibira et al. |
| 6,705,394 B1 | 3/2004 | Moslehi et al. |
| 6,847,014 B1 | 1/2005 | Benjamin et al. |
| 6,921,724 B2 | 7/2005 | Kamp et al. |
| 6,951,587 B1 | 10/2005 | Narushima |
| 7,274,004 B2 | 9/2007 | Benjamin et al. |
| 7,965,283 B2 | 6/2011 | Umezaki |
| 2002/0020358 A1 | 2/2002 | Hey et al. |
| 2003/0066587 A1 | 4/2003 | Yushio et al. |
| 2005/0173404 A1 | 8/2005 | Benjamin et al. |

FOREIGN PATENT DOCUMENTS

| | | |
|---|---|---|
| JP | 6-283594 A | 10/1994 |
| JP | 3-010443 U | 5/1995 |
| JP | 7-201822 A | 8/1995 |
| JP | 07-307334 | 11/1995 |
| JP | 09-036052 H | 2/1997 |
| JP | 10-144655 A | 5/1998 |
| JP | 11-145225 | 5/1999 |
| JP | 11-243077 A | 9/1999 |
| JP | 2000-216140 A | 8/2000 |
| JP | 2000-332089 A | 11/2000 |
| JP | 2001-102436 A | 4/2001 |
| JP | 2002-076103 A | 3/2002 |
| JP | 2002-252271 A | 9/2002 |
| JP | 2002-313901 A | 10/2002 |
| JP | 2002-359281 A | 12/2002 |
| JP | 2003-060016 A | 2/2003 |
| WO | WO02/089531 A1 | 11/2002 |
| WO | WO2004/077505 A2 | 9/2004 |

OTHER PUBLICATIONS

International Search Report and Written Opinion mailed Jun. 2, 2006 for PCT/US2005/043801.

Supplementary European Search Report mailed Jan. 5, 2006 for EP 02723949.

Office Action dispatched Aug. 2, 2010 for Japanese Appln. No. 2007-544574.

Office Action dispatched Dec. 19, 2011 for Japanese Appln. No. 2007-544574.

Office Action dispatched Apr. 23, 2012 for Japanese Appln. No. 2009-136934.

Office Action dispatched Mar. 18, 2013 for Japanese Appln. No. 2011-176261.

(Prior Art)

FIG. 1

(Prior Art)

METHOD FOR CONTROLLING SPATIAL TEMPERATURE DISTRIBUTION ACROSS A SEMICONDUCTOR WAFER

CROSS-REFERENCES

This application is a divisional application of U.S. patent application Ser. No. 11/004,179, filed Dec. 2, 2004 now abandoned, entitled Method and Apparatus for Controlling Spatial Temperature Distribution, which is a continuation-in-part of U.S. patent application Ser. No. 10/062,395, filed Feb. 1, 2002 now U.S. Pat. No. 6,847,014, which is, in turn, a continuation-in-part of U.S. patent application Ser. No. 09/846,432, filed Apr. 30, 2001 (now abandoned), in the name of inventors Neil Benjamin and Robert Steger, entitled "Method and Apparatus for Controlling the Spatial Temperature Distribution Across the Surface of a Workpiece Support", commonly assigned herewith and incorporated herein by reference.

FIELD OF THE INVENTION

The present invention relates to substrate support. More particularly, the present invention relates to a method and apparatus for achieving uniform temperature distribution within a substrate during plasma processing.

BACKGROUND OF THE INVENTION

A typical plasma etching apparatus comprises a reactor in which there is a chamber through which reactive gas or gases flow. Within the chamber, the gases are ionized into a plasma, typically by radio frequency energy. The highly reactive ions of the plasma gas are able to react with material, such as a polymer mask on a surface of a semiconductor wafer being processed into integrated circuits (IC's). Prior to etching, the wafer is placed in the chamber and held in proper position by a chuck or holder which exposes a top surface of the wafer to the plasma. There are several types of chucks (also sometimes called susceptors) known in the art. The chuck provides an isothermal surface and serves as a heat sink for the wafer removing heat imparted to the wafer by the plasma. In one type of chuck, a semiconductor wafer is held in place for etching by mechanical clamping means. In another type of chuck, a semiconductor wafer is held in place by electrostatic force generated by an electric field between the chuck and wafer. The present invention is applicable to both these types of chucks.

In a typical plasma etching operation, the reactive ions of the plasma gas chemically react with portions of material on a face of the semiconductor wafer. Some processes cause some degree of heating of the wafer, but most of the heating is caused by the plasma. The reaction between the plasma (ions and radicals) and wafer material, on the other hand, is accelerated to some degree by the temperature rise of the wafer. Local wafer temperature and rate of reaction at each microscopic point on the wafer are related to an extent that harmful unevenness in etching of material over a face of the wafer can easily result if the temperature of the wafer across its area varies too much. In most cases, it is highly desirable that etching be uniform to a nearly perfect degree since otherwise the integrated circuit devices (ICs) being fabricated will have electronic characteristics that deviate from the norm more than is desirable. Furthermore, with each increase in the size of wafer diameter, the problem of ensuring uniformity of each batch of ICs from larger and larger wafers becomes more difficult. In some other cases, it would be desirable to be able to control the surface temperature of the wafer to obtain a custom profile.

Figure 1:
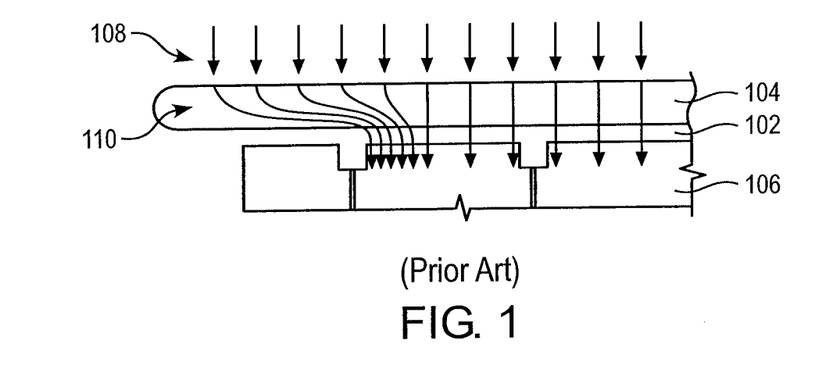
FIG. 1 is a schematic elevational diagram of a support holding a wafer under process in accordance with the prior art.

The problem of temperature rise of a wafer during reactive ion etching (RIE) is well known, and various attempts in the past to control the temperature of a wafer during RIE have been tried. FIG. 1 illustrates one way to control wafer temperature during RIE. A coolant gas (such as helium) is admitted at a single pressure within a single thin space 102 between the bottom of the wafer 104 and the top of the chuck 106 which holds the wafer 104.

Figure 2:
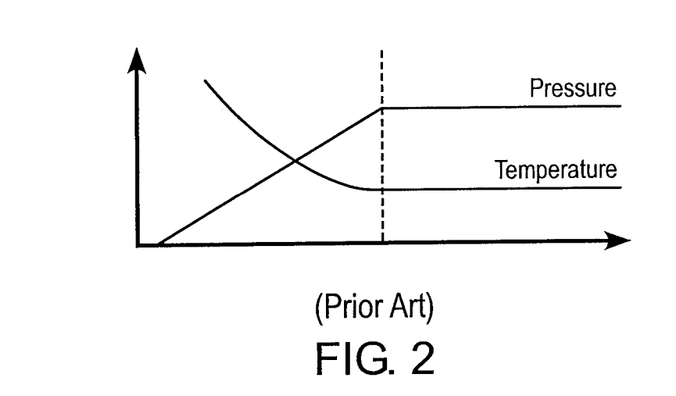
FIG. 2 is a plot illustrating the temperature of a wafer and the pressure of a coolant in the apparatus of FIG. 1 in accordance with the prior art.

There is generally no o-ring or other edge seal at the chuck perimeter except for a smooth sealing land extending from about 1 to about 5 mm at the outer edge of the chuck 106 in order to reduce coolant leakage. Inevitably, without any elastomer seal there is significant and progressive pressure loss across the sealing land, such that the edge of the wafer 104 may be inadequately cooled. The heat flux 108 impinging near the edge of the wafer 104 must therefore flow significantly radially inward before it can effectively be conducted away to the chuck. The arrows 106 on top of the wafer 104 illustrate the incoming flux heating the wafer 104. The flow of the heat in the wafer 104 is illustrated with the arrows 110. This explains why the edge zone of the chuck always tends to be hotter than the rest of the surface. FIG. 2 illustrates a typical temperature distribution on the wafer 104. The pressure loss at the peripheral portions of the wafer 104 causes the wafer 104 to be much hotter at the peripheral portions.

One way of dealing with the need for zone cooling is to vary the surface roughness or to cut a relief pattern to effectively change the local contact area. Such a scheme can be used without backside coolant gas at all, in which case the contact area, surface roughness, and clamp force determine the heat transfer. However the local contact area can only be adjusted by re-machining the chuck. Another way of dealing with the need for zone cooling is to use coolant gas whose pressure is varied to increase and fine tune thermal transport. However the relief pattern is still substantially fixed. By dividing the surface of the chuck into different zones, with or without small sealing lands as dividers, and supplying separate cooling gasses to each zone, a greater degree of independent spatial control may be achieved. The gas supply to each zone may have different composition or be set to a different pressure, thus varying the thermal conduction. Each zone's operating conditions may be set under recipe control, or even dynamically stabilized during each process step. Such schemes depend on redistributing the incoming heat flux from the plasma and extracting it into different regions. This is relatively effective at high power flux but will only give small temperature differentials at lower power flux. For instance, with about 1 W per $cm^2$ of uniform flux and about 3 mm sealing land, it is possible to get center to edge thermal gradients that lead to a 10° C. to 30° C. temperature increase near the wafer periphery. Thermal gradients of this magnitude can be very effective as a process control parameter. However, other processes may run at low power, for instance poly gate processes, may have a flux of only 0.2 W per $cm^2$. Unless the average conduction is made extremely low, which is very difficult to control and tends to result in inadequate overall cooling, then there will be only a very small differential of typically less than 5° C.

Accordingly, a need exists for a method and apparatus for controlling the temperature of semiconductor wafers during reactive ion etching and similar processes without requiring significant plasma heat flux. A primary purpose of the present invention is to solve these needs and provide further, related advantages.

BRIEF DESCRIPTION OF THE INVENTION

A chuck for a plasma processor comprises a temperature-controlled base, a thermal insulator, a flat support, and a heater. The temperature-controlled base is controlled in operation a temperature below the desired temperature of a workpiece. The thermal insulator is disposed over at least a portion of the temperature-controlled base. The flat support holds a workpiece and is disposed over the thermal insulator. A heater is embedded within the flat support and/or mounted to an underside of the flat support. The heater includes a plurality of heating elements that heat a plurality of corresponding heating zones. The power supplied and/or temperature of each heating element is controlled independently. The heater and flat support have a combined temperature rate change of at least 1° C. per second.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Embodiments of the present invention are described herein in the context of a workpiece support. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 3:
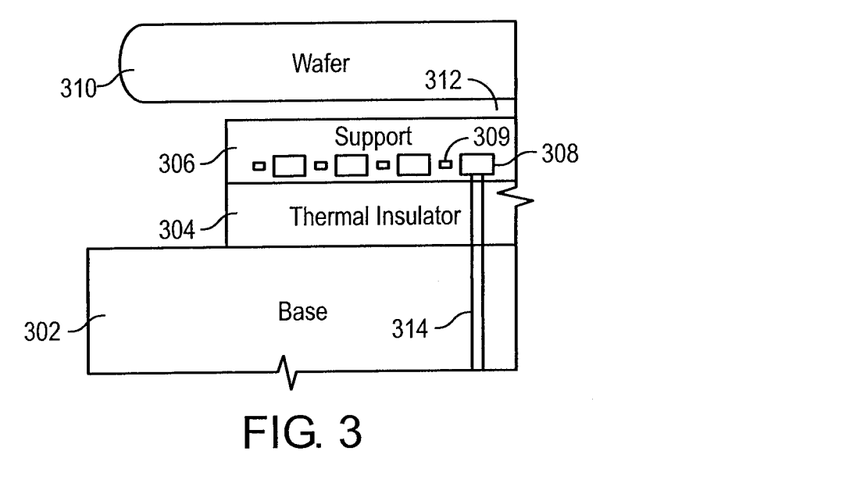
FIG. 3 is a schematic elevational diagram illustrating an apparatus for controlling the temperature of a workpiece in accordance with one embodiment of the present invention.

The apparatus of the present invention seeks to achieve precise significant thermal differential control, for example over 5° C., but without requiring significant plasma heat flux, for example less than 2 W per cm². FIG. 3 is a schematic elevational diagram illustrating an apparatus for controlling the temperature of a workpiece in accordance with one embodiment of the present invention. A temperature-controlled base 302 or a heat exchanger has a constant temperature below the desired temperature of a wafer 310. The base 302 supports a thermal insulator 304. A support 306, preferably flat, is mounted on top of the thermal insulator 304. A heater 308 is embedded in the support 306. A wafer 310 is disposed on top of the support 306. A thermal conductor 312 provides an intimate thermal contact between the support 306 and the wafer 310. The thermal conductor 312 may be preferably a gas, such as helium. The pressure of the helium controls the thermal conduction between the wafer 310 and the support 306. However, the thermal conductivity of the thermal conductor 312 may be less pressure sensitive at higher pressure such as 20 or 30 Torr.

In one embodiment, the base 302 comprises a metallic material, preferably an aluminum base cold plate, that is maintained at a relatively constant temperature and is held in operation at a laterally uniform temperature through a conventional heat exchange system such as a cooling/heating fluid loop. In another embodiment, the base 302 may also comprise a non-metallic material, such as aluminum nitrate. However, the base 302 must be chilled to a greater extent than in standard operation without the heater 308. For example, the temperature of the base 302 may be 10° C. to 50° C. below the desired temperature of the wafer 310. The base 302 also provides a thermal sink for plasma heating. An external coolant chiller (not shown) may be used to maintain the temperature of the base 302. Preferably, the amount of heat removed by the external coolant chiller and the temperature of the coolant may be limited to less than 2000 W and −20° C., respectively. The greater capacity of the chiller side helps with the thermal response—it may be more economically practical to limit one to two kW operation. The base 302 further have several holes or cavities (not shown) through which heater power lines 314 or other service lines are disposed. Such service lines 314 may comprise power lines for the heater, sensors, high voltage electrostatic clamping, gas feed, and wafer lifting. Those of ordinary skill in the art will now recognize that the service lines are not limited to the ones previously cited.

In one embodiment, the thermal insulator 304 acts as a significant thermal impedance break between the support 306 and the base 302. The thermal insulator 304 may comprise a thick RTV bonding adhesive layer, or be made of polymer, plastic, or ceramic. However, the thermal impedance break of the thermal insulator 304 cannot be too excessive otherwise the wafer 310 will be insufficiently cooled. For example, the thermal insulator may for example have a thermal conductivity of a range of about 0.05 W/mK to about 0.20 W/mK. The thermal insulator 304 in this case both acts as a thermal resistive element and a bond between the support 306 and the base 302. Furthermore, the thermal insulator 304 must be such that adequate RF coupling between the plasma and the base 302 is maintained. Also, the thermal insulator 304 must tolerate significant thermal-mechanical shear due to different materials and temperatures located above and below the layer. Thermal insulator 304 may further incorporate several cavities or vias (not shown) contiguous to the cavities of the base 302 for housing parts of the heater power lines 314 and other service lines.

In one embodiment, the support 306 comprises a ceramic material. The ceramic may be a non-electrically conductive material, such as, for example, the ceramic alumina. The shape of the support 306 may preferably include a conventional disk commonly used in plasma etching systems. The support 306 may be a conventional electrostatic chuck or may be a ceramic having a mechanical clamp for holding down the wafer 310. According to another embodiment, the support 306 construction is of a "thin disk bonded to a base" type, otherwise the lateral conduction may be so high that the heater input will be spread laterally resulting in an ineffective zone separation. The support 306 should allow the heat to dissipate locally.

The heater 308 comprises at least one resistive heating element. According to one embodiment, the heater 308 may be embedded in the support 306 below the clamp electrode plane and be shaped in any desirable pattern, for example, symmetrical or arbitrary. The heater 308 may also include one or more planar heating elements. Each heating element defines a heating zone or region that may be controlled independently. The multi-zone pattern has one or more planar heating elements acting in opposition to the conduction cooling to the support 306. The temperature rate change caused by the heater 308 to the support 306 may be at least 1° C. per second.

At least one sensor 309 associated with each heating zone may measure the temperature of each heating zone and send a signal to a controller or computer system (see FIG. 7) to monitor and control each individual planar heating element. For example, the sensor may be an infrared emission sensor or thermo-couple sensor that can be mounted either through ports to read directly from the wafer 310. The sensors 309 can also be mounted within or to the back of the support 306. The heater 308 may be powered by power lines 312 disposed through openings 314 in the thermal insulator 304 and the base 302.

In one embodiment, heater 308 comprises an inductive heater. In another embodiment, heater 308 comprises a heating lamp, such as a krypton or quartz lamp. According to yet another embodiment, heater 308 comprises thermoelectric modules that can cool or heat. With thermoelectric modules, a base and a thermal break may be optional. Those of ordinary skill in the art will now recognize that many other ways exists to heat support 306.

Figure 4:
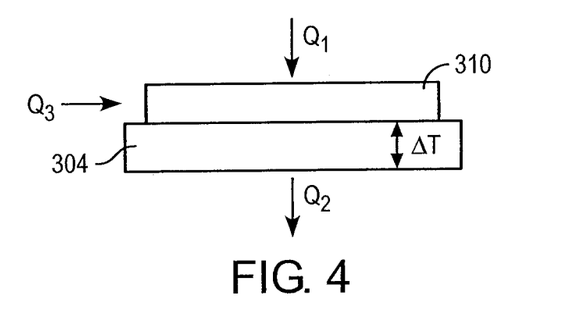
FIG. 4 illustrates a simplified schematic of thermal flow dynamic in the apparatus of FIG. 3.

FIG. 4 illustrates a simplified schematic of thermal flow dynamic in the apparatus of FIG. 3. The incoming plasma heat flux Q1 contributes to the temperature T1 on the surface of the wafer 310. Heater 308 provides additional heat flux Q3 to the wafer support 306 and thereby to the wafer 310. The flux Q2 exiting the system through the support 306 and thermal insulator 304 to the cooled base 302 is approximately equal to both incoming flux Q1 and Q3. Therefore:

$$Q1+Q3 \approx Q2$$

By definition, the sum of the temperature T1 of the wafer 310 and the differential temperature $\Delta T$ through the thermal insulator 304 is equal to the temperature T2 of the cooled base 302:

$$T2=T1+\Delta T$$

It should be noted that $\Delta T$ is defined by the thermal conductivity of the thermal insulator 304. The additional heat flux Q3, which is produced by heater 308, thus controls $\Delta T$. Therefore, the power supplied to the heater 308 can be adjusted so as to produce a desired temperature T1 on the surface of the wafer for a range of Q1.

Preferably, the temperature of the base 302 is set to produce an exiting flux Q2 of approximately half of the maximum incoming flux of Q3 when there are no incoming flux Q1 and the maximum flux of Q3 is approximately equal to the maximum flux of Q1:

$$Q2 \approx \frac{1}{2} Q3_{max}$$

when Q1=0 and $Q3_{max} \approx Q1_{max}$

In this preferred scheme, the range over which the temperature T1 of the wafer 310 can be varied is maximized. That is, the local temperature of the wafer can be adjusted by controlling the heating power of the heater 308 in a multizone heating pattern scheme. According to one embodiment, the temperature of the base 302 is controlled to about 20° C. cooler than a conventional apparatus in which the sum of the maximum value of Q1 and the maximum value of Q3 is equal to the maximum value of Q2.

Figure 5:
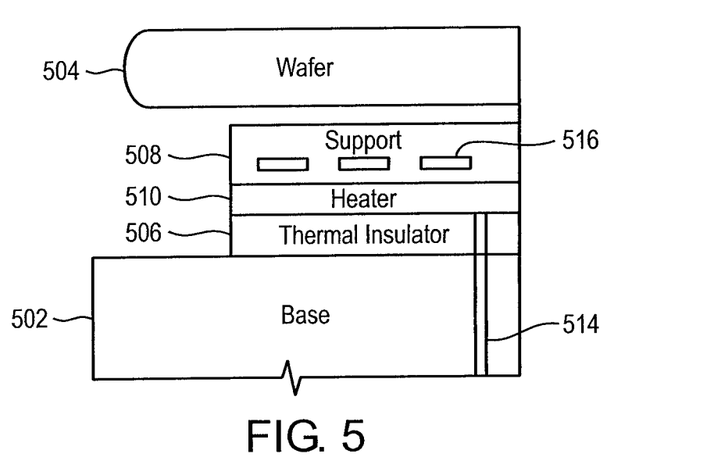
FIG. 5 is a schematic elevational diagram illustrating an apparatus for controlling the temperature of a workpiece in accordance with another embodiment of the present invention.

FIG. 5 illustrates another embodiment of the chuck. A chuck for a plasma processor has a temperature-controlled base 502 having a temperature below the desired temperature of a wafer 504. A layer of thermal insulation material 506 is disposed over the base 502. A flat support 508 used for holding the wafer 504 is disposed on top of the layer of thermal insulation material 506. A heater 510 is mounted to an underside of the flat support 508. The base 502 and layer 506 of thermal insulation material may further include holes or cavities (not shown) through which heater power lines 514 or other service lines are disposed. Such service lines 514 may comprise power lines for the heater, sensors, high voltage electrostatic clamping. Those of ordinary skills in the art will recognize that the service lines are not limited to the ones previously cited.

The heater 510 may be powered by power lines 312 disposed through openings 514 in the thermal insulator 506 and the base 502. The heater 510 includes at least one resistive heating element. According to one embodiment, the heater 510 may be mounted to an underside of the support 508 and be shaped in any desirable pattern, for example, symmetrical or arbitrary. (See FIG. 8 for example). The heater 510 may include one or more planar heating elements. Each heating element may define a heating zone or region that may be controlled independently. The multi-zone pattern has one or more planar heating elements acting in opposition to the conduction cooling to the support 508.

At least one sensor 516 associated with each heating zone may measure the temperature of each heating zone and send a signal to a controller or computer system (see FIG. 7) to monitor and control each individual planar heating element. For example, the sensor may be an infrared emission sensor or thermo-couple sensor that can be mounted either through ports to read directly from the wafer 504. The sensors 516 may be embedded within the support 508.

Figure 8:
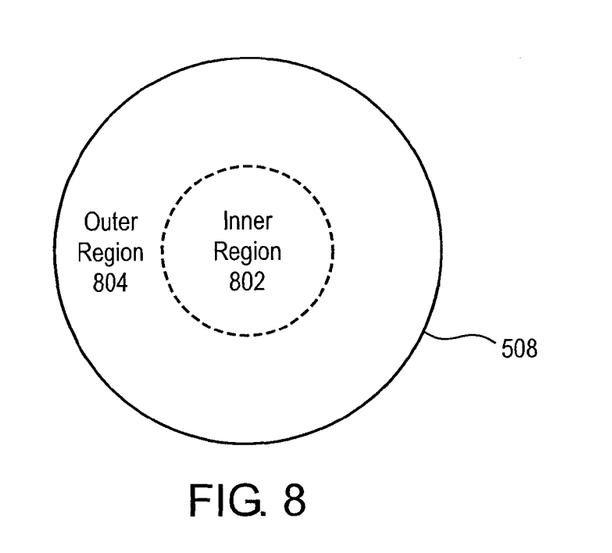
FIG. 8 is a schematic diagram illustrating an example of a wafer support have two spatial regional zones in accordance with one embodiment of the present invention.

FIG. 8 illustrates an example of a support 508 having dual heating region: inner region 802 and outer region 804. Each region may be independently heated by its own set of heaters (not shown). Those of ordinary skills in the art will recognize that the support may includes regions geometrically defined in many other ways.

The increased complexity of semiconductor devices has engendered the use of multistep processes wherein a single etch recipe includes multiple steps that are used to vary the etching conditions as the etching process proceeds. Multistep etching processes are used, for example, where a photoresist mask is used to etch a nitrite layer which is in turn used as an etching mask for sub-sequent layers. Additionally, the etching of particular layers is enhanced with processing conditions which change during the execution of the etch. In particular, it is often desirable to execute one portion of the etching process at an initial temperature and subsequently change the temperature in later steps within this recipe so as to provide optimum etching conditions for the particular layer being etched.

It is known that some etching process conditions are far more temperature sensitive than other process conditions and as such, it is desirable to be able to alter the wafer temperature step-by-step within an etch recipe, either to compensate for or to utilize, this temperature sensitivity of the etching process. For example, the relative etch rates vertically and laterally differ with temperature under some processing conditions, and this effect can be used to alter that tapered angle of the etch by altering the wafer temperature as the etching process progresses.

Under some processing conditions, the local concentration of reactance varies across the wafer such that the lateral etch rate varies across the wafer as well. This leads to variations in the etched feature dimensions across the wafer, which is generally undesirable. It has been observed that by using the temperature sensitivity of the lateral etch rate it is possible to induce a radial temperature gradient by altering the wafer support zone temperatures so as to induce a radial temperature gradient and thereby compensate for this variation in the local reactant concentration, producing conditions that result in constant feature dimensions across the entire wafer.

In the case where multiple layers are to be etched, it may be necessary to alter the radial temperature profile on a step-by-step basis as well as within a given step, depending upon the necessity to maintain feature dimensions across the wafer and/or to produce tapering within the layers. Thus, when a multizone temperature-controlled wafer support is used under conditions wherein the zones are operated at different temperatures, and a multistep recipe is employed which alters the process conditions during the etch, it is often necessary to also alter the temperature of the temperature-controlled wafer support zones in order to account for or to utilize the differing temperature sensitivity of the different etching conditions.

The duration of typical etching recipes is from approximately 20 seconds to approximately two minutes, and a typical recipe will have several steps within the recipe. As such, it is necessary to be able to alter a wafer support zone temperature within a few seconds for multistep temperature control. In most cases of interest, these temperature changes within a recipe are less than approximately 10° C. It is therefore desirable to be able to change zone temperatures at a rate of approximately 0.3° C. per second, and preferably to be able to change zone temperatures at a rate of 1° C./sec or faster.

For the case of the ceramic ESC having the embedded heater as described in FIG. 3, the basic design criteria for a fast ESC is that the thermal mass of the ceramic ESC be small and that the heater power density be large. It is also desirable that the thermal resistance of the thermal layer 304 below the ESC have relatively low thermal conductivity. Thus, the thickness of the ESC, the heater power density, and the thermal resistance are selected so as to permit temperature changes faster than about 1° C./sec.

Figure 6:
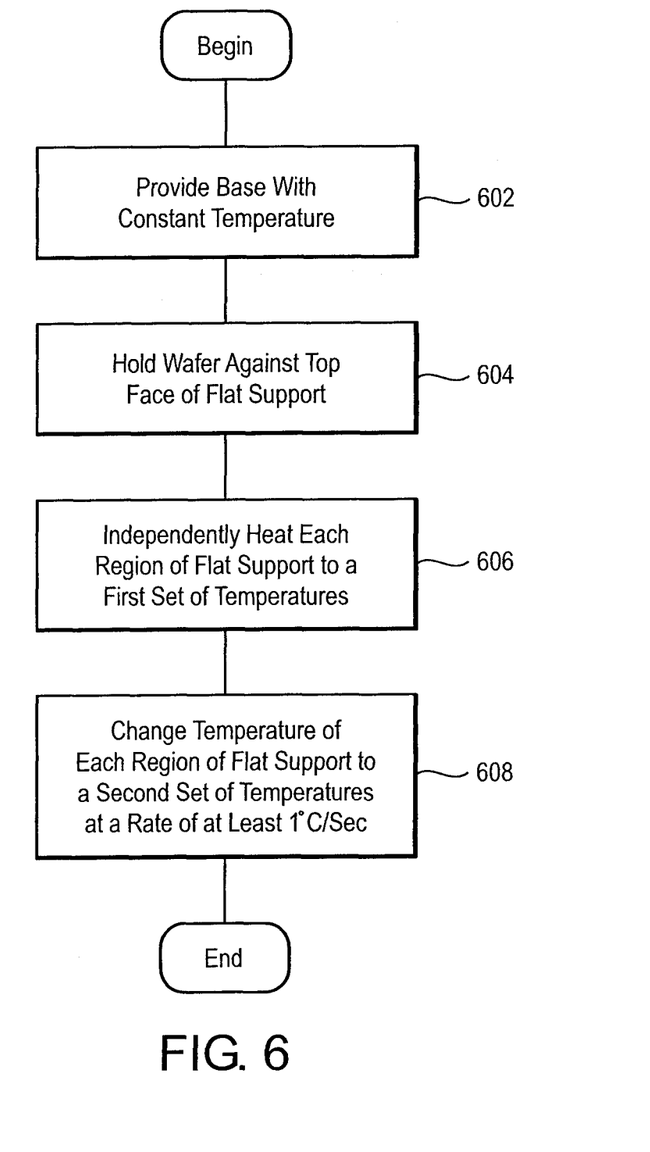
FIG. 6 is a flow diagram illustrating a method for controlling the temperature of a chuck during etching in accordance with one embodiment of the present invention.

FIG. 6 illustrates a flow diagram implementing the above solution by spatially but also temporally controlling the temperature of each region of a flat support during an etching process. In particular, FIG. 6 also illustrates a method for processing a wafer during an etching process. At 602, a base is provided. The base is maintained at a constant temperature that is below the temperature of the wafer to be processed. As previously described, a layer of thermal insulation material is mounted on top of the base. At 604, the wafer is held against a top face of a flat support which includes distinct spatial regions. As previously described, the flat support is mounted on top of the layer of thermal insulation material. At 606, each spatial region of said flat support is independently heated to an initial temperature with at least one heater mounted to an underside of the flat support or embedded within the flat support. The initial temperature for each region may differ from one another. At 608, the temperature of at least one spatial region of the flat support during the etching process is altered to another temperature at a rate of at least 1° C. per second. The final temperature for each region may differ from one another.

In accordance with another embodiment, the temperature of each spatial region may be further monitored with a sensor placed inside each spatial region. The signal generated by the sensors may be used to adjust the temperature of each spatial region by changing the power supplied to the heaters.

Figure 7:
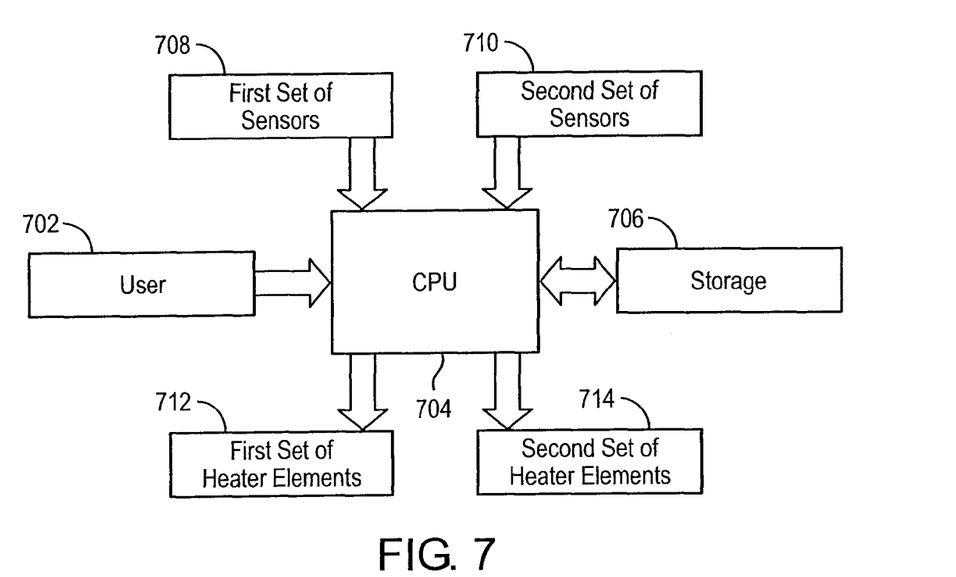
FIG. 7 is a schematic diagram of a system for controlling the temperature of a chuck in accordance with one embodiment of the present invention.

FIG. 7 is a schematic diagram of a system for controlling the temperature of a chuck in accordance with one embodiment of the present invention. A user 702 may define a set of parameters to a computer 704. Such set of parameters may be, for example, the desired temperature of a first zone on the chuck, the desired temperature of a second zone on the chuck. Those of ordinary skills in the art will recognize that the chuck may have one or more zones. The computer 704 communicates with a storage component 706 storing the algorithm of FIG. 6, inputs and outputs of computer 704. A first set of sensors 708 measures the first zone on the chuck. A second set of sensors 710 measures the second zone on the chuck. Based on the temperature measurement of the first set of sensors 708, computer 704 sends controls to the first set of heating elements 712 to adjust the temperature of the first zone on the chuck. Based on the temperature measurement of the second set of sensors 710, computer 704 sends controls to the second set of heating elements 714 to adjust the temperature of the second zone on the chuck.

These generalized methods for controlling the temperature profile of a wafer on an electrostatic chuck are not only suited to application in a Inductive Coupled Plasma (ICP) processing machine, but also in any other system application, especially one that requires a low plasma power flux to the wafer. This technique may be applied to any other applications where a need to produce thermal grading exists.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A method for controlling the spatial temperature across a semiconductor wafer during a multistep plasma etching process wherein wafer temperature is changed for the particular layer being etched comprising:

maintaining a base at a constant temperature, said constant temperature being below the temperature of the substrate, said base having a layer of thermal insulation material mounted on top of said base;

electrostatically clamping the substrate against a top face of a flat support having a plurality of spatial regions, said flat support mounted on top of said layer of thermal insulation material;

plasma etching a layer on the wafer under conditions such that local concentration of reactants varies across the wafer;

independently heating each spatial region of said flat support with a plurality of heaters mounted to an underside of said flat support so as to induce a radial temperature gradient which compensates for the local reactant concentration; and changing the temperature of at least one spatial region of said flat support during the multistep etching process at a rate of at least 1° C. per second;

wherein heat flux impinging on the wafer from the plasma is less than 2 W/cm$^2$.

2. The method of claim 1 further comprising monitoring the temperature of said plurality of spatial regions with a sensor placed in each region.

3. The method of claim 2 further comprising adjusting the temperature of each spatial region based on said monitoring.

4. The method of claim 1 wherein said plurality of heaters includes a plurality of electrically resistive heaters.

5. The method of claim 1 wherein said multistep etching is carried out for a time period of 20 seconds to 2 minutes.

6. The method of claim 1 wherein said multistep etching comprises etching multiple layers and altering the radial temperature profile on a step-by-step basis and within each step of the multistep etching process.

7. The method of claim 1 wherein said multistep etching comprises changing temperature in one or more of the spatial regions by less than 10° C.

8. The method of claim 1, wherein an outer edge of the wafer extends radially outward from an outer edge of the flat support and heat flux impinging on the outer edge of the wafer flows radially inward.

9. The method of claim 1, wherein the layer of thermal insulation provides a thermal impedance break between the base and the flat support, the layer of thermal insulation having a thermal conductivity of 0.05 to 0.20 W/mk.

10. The method of claim 1, wherein the base is maintained at a temperature 10 to 50° C. below the temperature of the substrate.

11. A method for controlling the spatial temperature across a semiconductor wafer during a multistep plasma etching process wherein wafer temperature is changed for the particular layer being etched comprising:

a. maintaining a base at a constant temperature, said constant temperature being below the temperature of the substrate, said base having a layer of thermal insulation material mounted on top of said base;

b. electrostatically clamping the substrate against a top face of a flat support having a plurality of spatial regions, said flat support mounted on top of said layer of thermal insulation material;

c. independently heating each spatial region of said flat support with a plurality of heaters embedded within said flat support so as to induce a radial temperature gradient which compensates for the local reactant concentration; and d. changing the temperature of at least one spatial region of said flat support during the multistep etching process at a rate of at least 1° C. per second;

wherein heat flux impinging on the wafer from the plasma is less than 2 W/cm$^2$.

12. The method of claim 11 further comprising monitoring the temperature of said plurality of spatial regions with a sensor placed in each region.

13. The method of claim 12 further comprising adjusting the temperature of each spatial region based on said monitoring.

14. The method of claim 11 wherein said plurality of heaters includes a plurality of electrically resistive heaters.

15. The method of claim 11 wherein said multistep etching is carried out for a time period of 20 seconds to 2 minutes.

16. The method of claim 11 wherein said multistep etching comprises etching multiple layers and altering the radial temperature profile on a step-by-step basis and within each step of the multistep etching process.

17. The method of claim 11 wherein said multistep etching comprises changing temperature in one or more of the spatial regions by less than 10° C.

18. The method of claim 11, wherein an outer edge of the wafer extends radially outward from an outer edge of the flat support and heat flux impinging on the outer edge of the wafer flows radially inward.

19. The method of claim 11, wherein the layer of thermal insulation provides a thermal impedance break between the base and the flat support, the layer of thermal insulation having a thermal conductivity of 0.05 to 0.20 W/mk.

20. The method of claim 11, wherein the base is maintained at a temperature 10 to 50° C. below the temperature of the substrate.

* * * * *